(12) United States Patent
Sugiura (10) Patent No.: US 8,269,290 B2
(45) Date of Patent: Sep. 18, 2012

(54) SEMICONDUCTOR DEVICE INCLUDING A PLURALITY OF SEMICONDUCTOR SUBSTRATES AND METHOD OF MANUFACTURING THE SAME

(75) Inventor: Kazuhiko Sugiura, Nagoya (JP)

(73) Assignee: DENSO CORPORATION, Kariya (JP)

( * ) Notice: Subject to any disclaimer, the term of this patent is extended or adjusted under 35 U.S.C. 154(b) by 334 days.

(21) Appl. No.: 12/461,971

(22) Filed: Aug. 31, 2009

(65) Prior Publication Data

US 2010/0065858 A1    Mar. 18, 2010

(30) Foreign Application Priority Data

Sep. 15, 2008  (JP) .................................. 2008-235813
Apr. 6, 2009   (JP) .................................. 2009-92393

(51) Int. Cl.
*H01L 29/84* (2006.01)
(52) U.S. Cl. ........ 257/415; 257/417; 257/774; 257/777; 257/E29.324
(58) Field of Classification Search .................. 257/415, 257/774, 777, 417, 418, E29.324, E25.03
See application file for complete search history.

(56) References Cited

U.S. PATENT DOCUMENTS

| | | | |
|---|---|---|---|
| 6,399,479 B1 | 6/2002 | Chen et al. | |
| 6,867,073 B1 | 3/2005 | Enquist | |
| 6,936,491 B2 | 8/2005 | Partridge et al. | |
| 7,153,718 B2 | 12/2006 | Fischer et al. | |
| 7,385,283 B2 * | 6/2008 | Wu et al. ......................... | 257/686 |
| 2001/0038148 A1 | 11/2001 | Mastromatteo et al. | |
| 2002/0135062 A1 | 9/2002 | Mastromatteo et al. | |
| 2003/0001221 A1 | 1/2003 | Fischer et al. | |
| 2004/0195638 A1 | 10/2004 | Fischer et al. | |
| 2004/0256727 A1 | 12/2004 | Aoyagi et al. | |
| 2005/0181542 A1 | 8/2005 | Enquist | |
| 2007/0029654 A1 | 2/2007 | Sunohara et al. | |
| 2007/0069350 A1 * | 3/2007 | Tsai et al. ..................... | 257/676 |
| 2007/0158787 A1 * | 7/2007 | Chanchani .................... | 257/619 |
| 2007/0158826 A1 | 7/2007 | Sakakibara et al. | |
| 2008/0044950 A1 | 2/2008 | Aoyagi et al. | |

(Continued)

FOREIGN PATENT DOCUMENTS

JP    A-61-246603    11/1986

(Continued)

OTHER PUBLICATIONS

Patel et al., "Silicon Carrier with Deep Through-Vias, Fine Pitch Wiring, and Through Cavity for Parallel Optical Transceiver", 55th ECTC, 2005, 1318-1324.*

(Continued)

*Primary Examiner* — Kenneth Parker
*Assistant Examiner* — Yu Chen
(74) *Attorney, Agent, or Firm* — Posz Law Group, PLC (57) ABSTRACT

In a semiconductor device, a first semiconductor substrate includes a first element on a first-surface side thereof, and a second semiconductor substrate includes a second element and a wiring part on a first-surface side thereof. The first semiconductor substrate and the second semiconductor substrate are attached with each other in such a manner that a first surface of the first semiconductor substrate is opposite a first surface of the second semiconductor substrate. A hole is provided from a second surface of the first semiconductor substrate to the wiring part through the first semiconductor substrate, and a sidewall of the hole is insulated. A drawing wiring part made of a conductive member fills the hole.

14 Claims, 9 Drawing Sheets

U.S. PATENT DOCUMENTS

| | | |
|---|---|---|
| 2008/0048335 A1 | 2/2008 | Han |
| 2008/0150153 A1 | 6/2008 | Enquist |
| 2008/0265430 A1 | 10/2008 | Ishihara |
| 2008/0302184 A1* | 12/2008 | Yamaguchi et al. ....... 73/514.32 |
| 2009/0297091 A1* | 12/2009 | Assefa et al. ................... 385/14 |

FOREIGN PATENT DOCUMENTS

| | | |
|---|---|---|
| JP | A-H03-067177 | 3/1991 |
| JP | A-09-064320 | 3/1997 |
| JP | A-2001-015722 | 1/2001 |
| JP | A-2002-134653 | 5/2002 |
| JP | A-2003-218282 | 7/2003 |
| JP | A-2003-218319 | 7/2003 |
| JP | A-2004-333133 | 11/2004 |
| JP | A-2007-150098 | 6/2007 |
| JP | A-2007-294746 | 11/2007 |
| JP | A-2007-305659 | 11/2007 |
| JP | A-2008-34448 | 2/2008 |
| JP | A-2008-53430 | 3/2008 |
| JP | A-2008-60135 | 3/2008 |
| JP | A-2008-76332 | 4/2008 |
| JP | A-2008-153403 | 7/2008 |

OTHER PUBLICATIONS

Office Action mailed Dec. 7, 2010 in corresponding JP application No. 2009-092393 (and English translation).

Office Action mailed Mar. 8, 2011 issued in the corresponding Japanese Application No. 2009-92393 (English translation enclosed).

* cited by examiner

SEMICONDUCTOR DEVICE INCLUDING A PLURALITY OF SEMICONDUCTOR SUBSTRATES AND METHOD OF MANUFACTURING THE SAME

CROSS REFERENCE TO RELATED APPLICATIONS

The present application is based on and claims priority to Japanese Patent Applications No. 2008-235813 filed on Sep. 15, 2008, and No. 2009-92393 filed on Apr. 6, 2009, the contents of which are incorporated in their entirety herein by reference.

BACKGROUND OF THE INVENTION

1. Field of the Invention

The present invention relates to a semiconductor device including a plurality of semiconductor substrates attached with each other. The present invention also relates a method of manufacturing a semiconductor device.

2. Description of the Related Art

A semiconductor device including a base substrate, various elements disposed at a surface portion of the base substrate, and a sealing cap disposed above the elements for protecting the elements and a method of manufacturing the semiconductor device are disclosed, for example, in JP-A-2004-333133, U.S. Pat. No. 6,936,491 and U.S. Pat. No. 7,153,718.

Figure 9A:
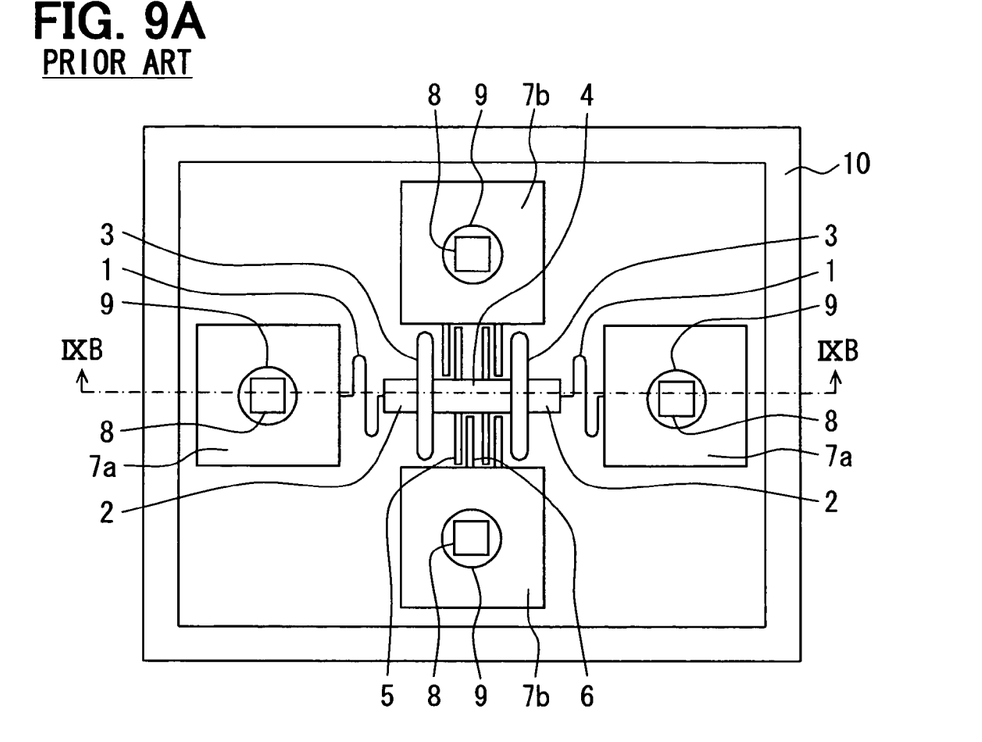
FIG. 9A is a plan view of an inertial force sensor according to the prior art and FIG. 9B is a cross-sectional diagram of the inertial force sensor taken along line IXB-IXB in FIG. 9A.
Figure 9B:
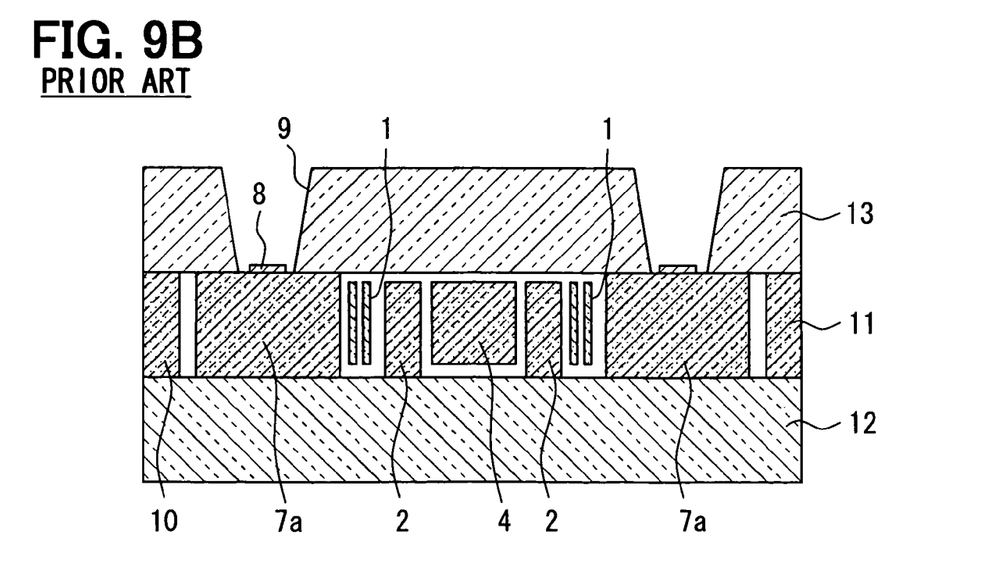

A semiconductor device disclosed in JP-A-2004-333133 will be described with reference to FIG. 9A and FIG. 9B. The semiconductor device is an inertial force sensor. For the sake of convenience, a right-left direction in FIG. 9A and FIG. 9B is called as a first direction, and an upper-lower direction in FIG. 9A perpendicular to the first direction is called as a second direction.

The inertial force sensor includes a device layer 11. In the device layer 11, springs 1, anchors 2, beams 3, island electrodes 7a and 7b, and a frame 10 are integrally formed. A lower surface of the device layer 11 is bonded to a lower substrate 12. An upper surface of the device layer 11 is bonded to an upper substrate 13. The device layer 11 is hermetically-sealed by the lower substrate 12 and the upper substrate 13.

The island electrodes 7a are configured to electrically couple movable electrodes 5 to an external device. The island electrodes 7b are configured to electrically couple fixed electrodes 6 to an external device. On an upper surface of each of the island electrodes 7a and 7b, an electrode pad 8 to be coupled with an external device is attached. The upper substrate 13 has through holes 9 at portions corresponding to the electrode pads 8 on the island electrodes 7a and 7b. Each of the electrode pads 8 is electrically coupled with an external device (not shown) such as an integrated circuit (IC) through a bonding wire passing through the through hole 9

The anchors 2 are fixed to the lower substrate 12. The island electrode 7a and 7b and the frame 10 are fixed to both of the lower substrate 12 and the upper substrate 13. The springs 1, the beams 3 and a mass body 4 are not fixed to the lower substrate 12 and the upper substrate 13. Each of the beams 3 is held by the corresponding one of the anchors 2. The mass body 4 is held by the beams 3 to be movable in the horizontal direction. Each of the springs 1 electrically couples one of the anchors 2 and a corresponding one of the island electrodes 7a.

In the second direction, the movable electrodes 5 are attached to two sides of the mass body 4. The fixed electrodes 6 are attached to each of the island electrodes 7b. At the two side of the mass body 4, the movable electrodes 5 are opposite the fixed electrodes 6 in the first direction. When the inertial force sensor receives inertial force in the first direction, the mass body 4 moves in the first direction due to the inertial force, distances between the movable electrodes 5 and the fixed electrodes 6 change, and an electrostatic capacity between the movable electrodes 5 and the fixed electrodes 6 changes. By detecting the change in the electrostatic capacity, the inertial force applied to the inertial force sensor can be detected.

In the inertial force sensor, the island electrodes 7a and 7b are insulated from each other. The movable electrodes 5 attached to the mass body 4 are electrically coupled with the island electrodes 7a through the beams 3, the anchors 2, and the springs 1. The island electrodes 7a are electrically coupled with an external device such as an IC through the electrode pads 8 and the bonding wires passing through the through holes 9. The fixed electrodes 6 attached to the island electrodes 7b are electrically coupled with en external device such as an IC through the island electrodes 7b, the electrode pads 8 disposed on the island electrodes 7b and the bonding wires passing through the through holes 9.

In the semiconductor device illustrated in FIG. 9A and FIG. 9B, an inertial force sensor element provided at the device layer 11 is protected by being hermetically-sealed by the lower substrate 12 and the upper substrate 13. The lower substrate 12 and the upper substrate 13 are used only for configurating the above-described sealing structure. In order to effectively use the lower substrate 12 and the upper substrate 13, a control circuit of the inertial force sensor element can be formed as long as the lower substrate 12 and the upper substrate 13 can seal the inertial force sensor element.

In the semiconductor device illustrated in FIG. 9A and FIG. 9B, each of the bonding wires is passed through one of the through holes 9 provided in the upper substrate 13 and is bonded to one of the electrode pads 8 on the island electrodes 7a and 7b so as to electrically couple the island electrodes 7a and 7b to the external device such as the IC. In order to bond the bonding wires, the upper substrate 13 is required to have large through holes 9 so that a bonding tool does not come in contact with the upper substrate 13. Thus, a dimension of a chip may increase and a production cost may increase. In addition, it is difficult to secure an insulating property with certainty after bonding and it is difficult to perform a wire bonding when the semiconductor device has a complicated three-dimensional wiring structure such as, for example, when a circuit is formed in the lower substrate 12 and the upper substrate 13.

SUMMARY OF THE INVENTION

In view of the foregoing problems, it is an object of the present invention is to provide a semiconductor device that includes a plurality of semiconductor substrates attached with each other. Another object of the present invention is to provide a method of manufacturing a semiconductor device.

A semiconductor device according to an aspect of the present invention includes a first semiconductor substrate, a second semiconductor substrate, a hole, and a drawing wiring part. The first semiconductor substrate has a first surface and a second surface. The first semiconductor substrate includes a first element on a first-surface side of the first semiconductor substrate. The second semiconductor substrate has a first surface and a second surface. The second semiconductor substrate includes a second element and a wiring part on a first-surface side of the second semiconductor substrate. The second semiconductor substrate is attached with the first semiconductor substrate in such a manner that the first surface of the second semiconductor substrate is opposite the first surface of the first semiconductor substrate. The hole is provided from the second surface of the first semiconductor substrate to the wiring part on the first-surface side of the second semiconductor substrate through the first semiconductor substrate. The hole has an insulated sidewall. The drawing wiring part is made of a conductive member and fills the hole.

In the above-described semiconductor device, the first element and the second element can be hermetically-sealed. In addition, the drawing wiring part can provide a certain wiring connection to wiring part disposed on the first-surface side of the second semiconductor substrate.

In a method of manufacturing a semiconductor device according to another aspect of the present invention, a first element is formed on a first-surface side of a first semiconductor substrate, a second element and a wiring part are formed on a first-surface side of a second semiconductor substrate, and the first semiconductor substrate and the second semiconductor substrate are attached with each other in such a manner that a first surface of the first semiconductor substrate is opposite a first surface of the second semiconductor substrate. A hole is provided from a second surface of the first semiconductor substrate to the wiring part formed on the first-surface side of the second semiconductor substrate through the first semiconductor substrate, and a sidewall of the hole is insulated. The hole is filled with a conductive member so as to form a drawing wiring part.

In the above-described method, the first element and the second element can be hermetically-sealed. In addition, a certain wiring connection to the wiring part on the first-surface side of the second semiconductor substrate can be formed.

BRIEF DESCRIPTION OF THE DRAWINGS

Additional objects and advantages of the present invention will be more readily apparent from the following detailed description of exemplary embodiments when taken together with the accompanying drawings. In the drawings:

FIG. 2A to FIG. 2C are diagrams illustrating examples of a pattern shape of wiring layers L1a and L2a;

DETAILED DESCRIPTION OF THE EXEMPLARY EMBODIMENTS

First Embodiment

A semiconductor device 100 according to a first embodiment of the present invention will be described with reference to FIG. 1.

The semiconductor device 100 includes a first semiconductor substrate 20 and a second semiconductor substrate 30. The first semiconductor substrate 20 has a main surface S1 and a rear surface. The first semiconductor substrate 20 includes a first element disposed on the main surface S1 side. The second semiconductor substrate 30 has a main surface S2 and a rear surface. The second semiconductor substrate 30 includes a second element disposed on the main surface S2 side. The first semiconductor substrate 20 and the second semiconductor substrate 30 are attached with each other on attached surfaces shown by a dashed line Sa in such a manner that the main surface S1 of the first semiconductor substrate 20 is opposite the main surface S2 of the second semiconductor substrate 30.

The first semiconductor substrate 20 includes a silicon-on-insulator substrate (SOI substrate) having a buried oxide layer 22, and the SOI substrate can be formed by a heat-treatment bonding technology. On the main surface S1 side of the buried oxide layer 22, an SOI layer 21 is disposed. On the rear surface side of the buried oxide layer 22, a supporting substrate 23 is disposed. The first element formed on the main surface S1 side of the first semiconductor substrate 20 may be a dynamic quantity sensor element similar to an inertial force sensor illustrated in FIG. 9A and FIG. 9B. The dynamic quantity sensor element formed in the first semiconductor substrate 20 includes movable electrodes E1 and fixed electrodes E2. The movable electrodes E1 are formed by a sacrifice-layer etching of a part of the buried oxide layer to be movable. Each of the movable electrodes E1 has a surface that is opposite a surface of an adjacent one of the fixed electrodes E2. A space K between the opposite surfaces of the movable electrodes E1 and the fixed electrodes E2 can function as a dielectric layer and can provide an electrostatic capacity. The movable electrodes E1 move in a direction perpendicular to the opposite surfaces, that is, a right-left direction in FIG. 1, in accordance with dynamic quantity applied to the dynamic quantity sensor element. A change in the electrostatic capacity due to a change in distances between the movable electrodes E1 and the fixed electrodes E2 is measured, and thereby the dynamic quantity is detected.

The second semiconductor substrate 30 is an SOI substrate having a buried oxide layer 32, and the SOI substrate can be formed by a heat-treat bonding technology. On the main surface S2 side of the buried oxide layer 32, an SOI layer 31 is disposed. On the rear surface side of the buried oxide layer 32, a supporting substrate 33 is disposed. The second element formed on the main surface S2 side of the second semiconductor substrate 30 configurates a control circuit of the dynamic quantity sensor element formed on the main surface S1 side of the first semiconductor substrate 20.

The second semiconductor substrate 30 includes wiring layers L1 and L2 on the main surface S2 side of the second semiconductor substrate 30. The semiconductor device 100 includes holes T1-T4 provided from the rear surface side of the first semiconductor substrate 20 to the wiring layers L1 and L2 through the first semiconductor substrate 20. A sidewall of each of the holes T1-T4 is insulated. The holes T1-T4 are filled with a conductive member 40 so as to form drawing wiring layers V1-V4. The drawing wiring layers V1-V2 can function as a drawing wiring part from the wiring layers L1 and L2 formed on the main surface S2 side of the second semiconductor substrate 30.

The first semiconductor substrate 20 includes a wiring layer L3 on the main surface S1 side of the second semiconductor substrate 30. The semiconductor device 100 has a hole T5 provided from the rear surface side of the first semiconductor substrate 20 to the wiring layer L3 through the first semiconductor substrate 20. A sidewall of the hole T5 is insulated. The hole T5 is filled with the conductive member 40 so as to form a drawing wiring layer V5. The drawing wiring layer V5 can function as a drawing wiring part from the wiring layer L3 formed on the main surface S1 side of the first semiconductor substrate 20.

The conductive member 40 may include one of metal and polycrystalline silicon, for example.

Figure 1:
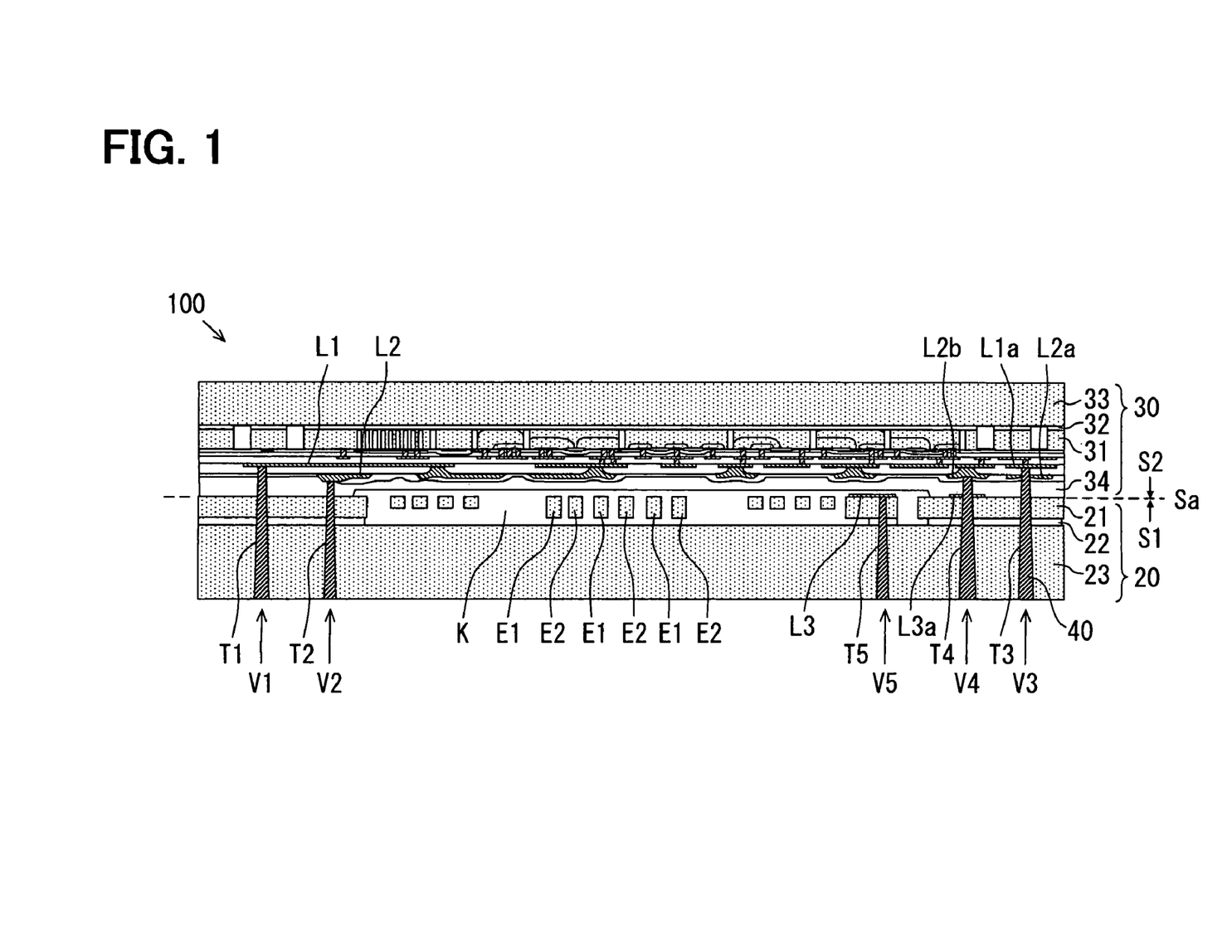
FIG. 1 is a cross-sectional diagram illustrating a semiconductor device according to a first embodiment of the present invention.

The semiconductor device 100 illustrated in FIG. 1 has a three-dimensional structure in which the first semiconductor substrate 20 including the first element on the main surface S1 side and the second semiconductor substrate 30 including the second element on the main surface S1 side are attached with each other in such a manner that the main surface S1 of the first semiconductor substrate S1 is opposite the main surface S2 of the second semiconductor substrate 30. The first element may be the dynamic quantity sensor element and the second element may configurate the control circuit of the dynamic quantity sensor element. In the semiconductor device 100, the first element and the second element are formed at the first semiconductor substrate 20 and the second semiconductor substrate 30, respectively. Thus, the first semiconductor substrate 20 and the second semiconductor substrate 30 are effectively used. In addition, in the semiconductor device 100, the first semiconductor substrate 20 and the second semiconductor substrate 30 are attached with each other in such a manner that the main surface S1 of the first semiconductor substrate 20 on which the first element is formed is opposite the main surface S2 of the second semiconductor substrate 30 on which the second element is formed. Thus, the first element and the second element are hermetically-sealed in the first semiconductor substrate 20 and the second semiconductor substrate 30 attached with each other.

In the semiconductor device illustrated in FIG. 1, the drawing wiring layers V1-V4 are formed so that the first element and the second element sealed in the first semiconductor substrate 20 and the second semiconductor substrate 30 can be electrically coupled with an external device. The drawing wiring layers V1-V4 are formed by providing the holes T1-T4 from the rear surface of the first semiconductor substrate 20 to the wiring layers. L1 and L2 through the first semiconductor substrate 20, insulating the sidewalls of the holes T1-T4 and filling the sidewall-insulated holes T1-T4 with the conductive member 40. Thus, the first element and the second element can be electrically coupled with an external device more certainly and more stably compared with a case using a bonding wire as electric drawing line. In addition, an electric drawing line by the drawing wiring layers V1-V4 can be applied to various sealed three-dimensional structures including the first element and the second element. Thus, a flexibility of design is high and a wiring design can be easy.

As described above, the semiconductor device 100 includes the first semiconductor substrate 20 and the second semiconductor substrate 30. The first semiconductor substrate 20 includes the first element formed on the main surface S1 side. The second semiconductor substrate 30 includes the second element formed on the main surface S2 side. The first semiconductor substrate 20 and the second semiconductor substrate 30 are attached with each other in such a manner that the main surface S1 of the first semiconductor substrate 20 is opposite the main surface S2 of the second semiconductor substrate 30. By attaching the first semiconductor substrate 20 and the second semiconductor substrate 30, the first element and the second element are hermetically-sealed. In addition, wiring connections to the first element and the second element that are three-dimensionally arranged can be provided with certainty by the drawing wiring layers V1-V5.

The drawing wiring layers V1-V4 in the semiconductor device 100 will be described below.

The wiring layers L1 and L2 are disposed on the main surface S2 side of the second semiconductor substrate 30 in such a manner that the wiring layers L1 and L2 are disposed at different depths. The drawing wiring layers V1 and V2 are coupled with the wiring layers L1 and L2, respectively. The drawing wiring layers V1 and V2 extends from the rear surface of the first semiconductor substrate 20 to the wiring layers L1 and L2 through the first semiconductor substrate 20. Thus, the drawing wiring layers V1 and V2 can be used as a drawing wiring part from the wiring layers L1 and L2 covered with a surface protecting layer 34. The drawing wiring layers V1 and V2 can also be used as drawing wires from an electrode formed on a surface of the second semiconductor substrate 30.

The hole T3 penetrates a part of a wiring layer L2a located at a shallower portion from the main surface S2 of the second semiconductor substrate 30 and reaches a wiring layer L1a located at a deeper portion from the main surface S2 of the second semiconductor substrate 30. The drawing wiring layer V3 formed in the hole T3 reaches the wiring layer L1a trough the part of the wiring layer L2a. The drawing wiring layer V3 is coupled with the wiring layer L1a and L2a disposed at different depths. The drawing wiring layer V3 can function as a coupling member between the wiring layers L1a and L2a located at different depths as well as a drawing wiring part from the wiring layers L1a and L2a.

Figure 2A:
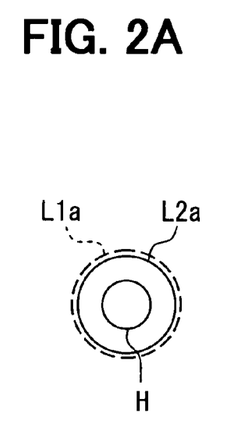
Figure 2B:
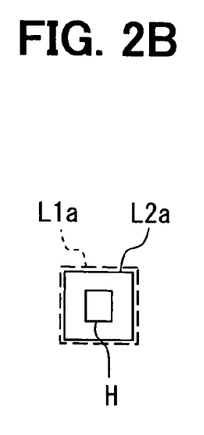
Figure 2C:
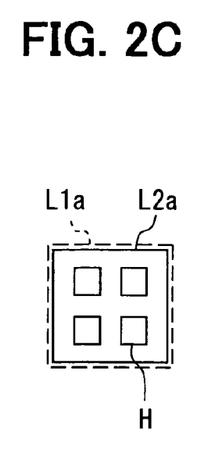

Examples of pattern shapes of the wiring layers L1a and L2a will be described with reference to FIG. 2A to FIG. 2C. In FIG. 2A to FIG. 2C, the pattern shapes of the wiring layer L1a located at the deeper portion are illustrated by dashed lines and the wiring layer L2a located at the shallower portion are illustrated by solid lines.

The wiring layer L2a illustrated in FIG. 2A has a circular ring shape. The wiring layer L2a illustrated in FIG. 2B has a square ring shape. The wiring layer L2a illustrated in FIG. 2C has a lattice shape. Each of the wiring layers L2a illustrated in FIG. 2A to FIG. 2C has one or more hole H. The hole T3 is provided to penetrate the hole H and the drawing wiring layer V3 coupled with the wiring layer L1a and L2a located at different depths are formed.

The hole T4 penetrates a wiring layer L3a formed one the main surface S1 side of the first semiconductor substrate 20 and reaches a wiring layer L2b formed one the main surface S2 side of the second semiconductor substrate 30. The drawing wiring layer V4 formed in the hole T4 reaches the wiring layer L2b trough the part of the wiring layer L3a. The drawing wiring layer V4 is coupled with the wiring layer L3a and the wiring layer L2b. The drawing wiring layer V4 can function as a coupling member between the wiring layer L3a formed in the first semiconductor substrate 20 and the wiring layer L2b formed in the second semiconductor substrate 30 as well as a drawing wiring part from the wiring layers L3a and L2b.

Figure 3A:
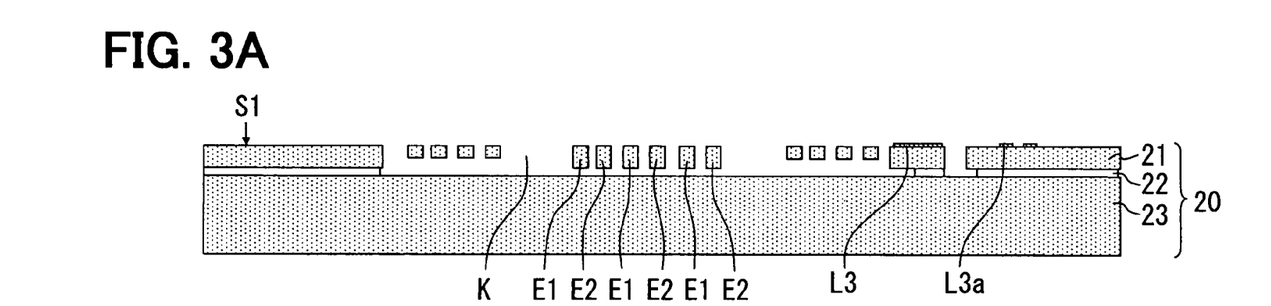
FIG. 3A to FIG. 3C are cross-sectional diagrams illustrating exemplary processes of manufacturing the semiconductor device illustrated in FIG. 1.

An exemplary method of manufacturing the semiconductor device 100 will be described with reference to FIG. 3A to FIG. 4B During a process illustrated in FIG. 3A, the first semiconductor substrate. 20 is prepared. On the main surface S1 side of the first semiconductor substrate 20, the first element and wiring layers L3 and L3a are formed. The first element may be a dynamic quantity sensor element.

Figure 3B:
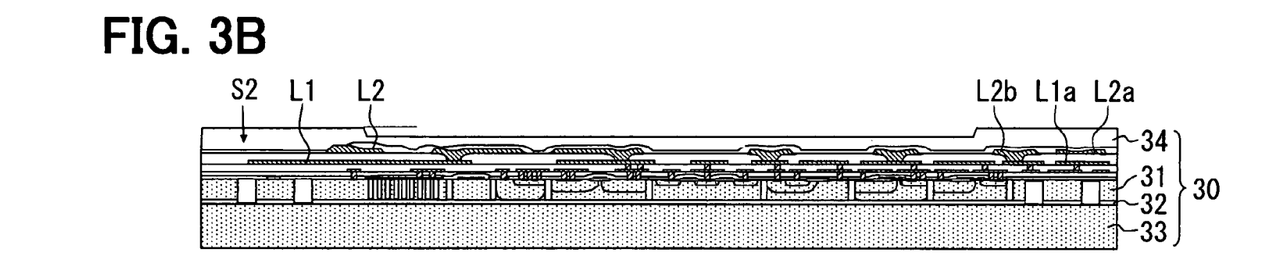

During a process illustrated in FIG. 3B, the second semiconductor substrate 30 is prepared. On the main surface S2 side of the second semiconductor substrate 20, the second element and the wiring layers L1, L2, L2b, L1a, L2a are formed. The second element may be an element configurating a control circuit of the dynamic quantity sensor element.

Figure 3C:
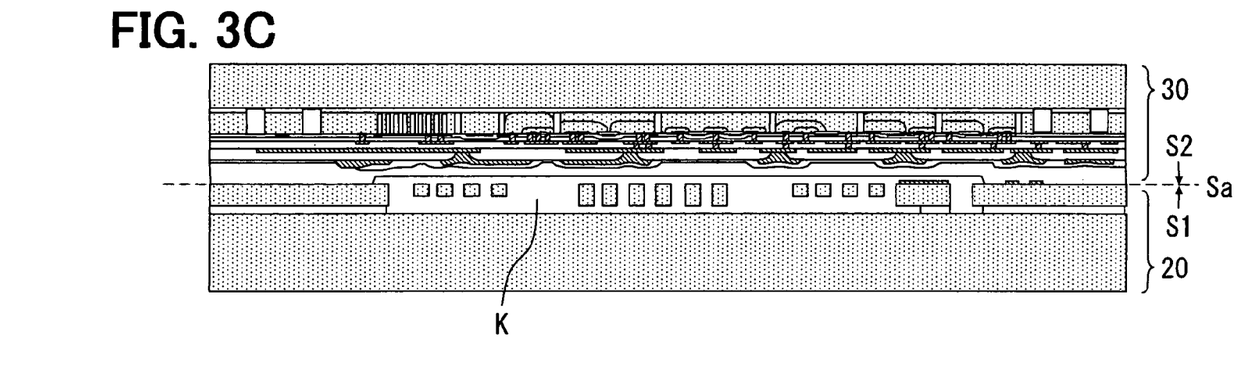

During a process illustrated in FIG. 3C, the first semiconductor substrate 20 and the second semiconductor substrate 30 are attached with each other in such a manner that the main surface S1 of the first semiconductor substrate 20 is opposite the main surface S2 of the second semiconductor substrate 30. The first semiconductor substrate 20 and the second semiconductor substrate 30 may be attached, for example, by a heat-treatment bonding technology or by using an adhesive.

Then, the attached substrate is arranged in such a manner that the rear surface of the first semiconductor substrate 20 faces upward. During a process illustrated in FIG. 4A, the holes T1-T4 are provided from the rear surface of the first semiconductor substrate 20 to the wiring layers L1, L2, L2a, L2b disposed on the main surface S2 side of the second semiconductor substrate 30 through the first semiconductor substrate 20. In addition, the hole T5 is provided from the rear surface of the first semiconductor substrate 20 to the wiring layer L3 disposed on the main surface S1 side of the first semiconductor substrate 20.

Figure 4A:
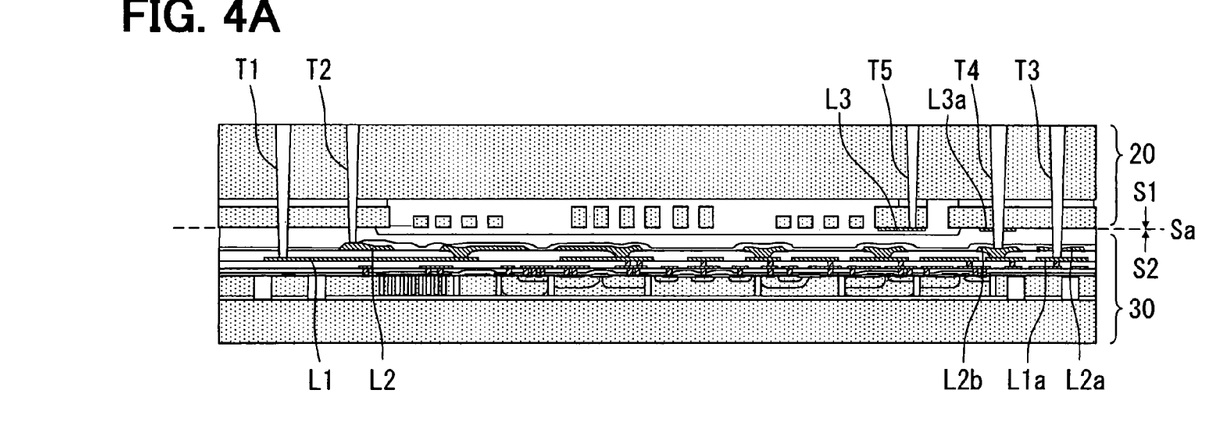
FIGS. 4A and 4B are cross-sectional diagrams illustrating exemplary processes of manufacturing the semiconductor device illustrated in FIG. 1.

During the process illustrated in FIG. 4A, the wiring layers L1-L3 located at different depths can be used as etching stoppers, and thereby the hole T1-T5 can be concurrently provided. Although the holes T1 and T2 reaching the wiring layers L1 and L2 located at different depths may also be provided at different processes, a production cost can be reduced by providing the holes T1 and T2 concurrently. A portion made of silicon may be etched using $SF_6$ (sulfur hexafluoride) as etching gas and a portion made of silicon oxide may be etched using $CF_4$ (tetrafluoromethane) as etching gas, for example. $SF_6$ and $CF_4$ may be replaced in turn or mixed gas of $SF_6$ and $CF_4$ may be used as etching gas.

Figure 4B:
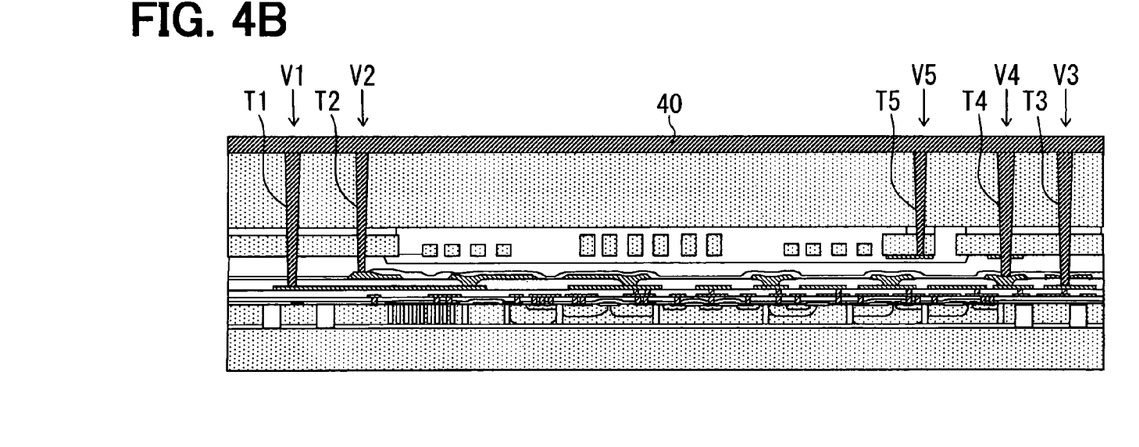

During a process illustrated in FIG. 4B, the sidewalls of the holes T1-T5 are insulated, and the conductive member 40 is deposited on the substrate. The holes T1-T5 are filled with the conductive member 40, and thereby the drawing wiring layers V1-V5 are formed. The sidewalls of the holes T1-T5 may be insulated by heat-treating the substrate. Alternatively, the sidewalls of the holes T1-T5 may be insulated by deposing an insulating film on the sidewalls of the holes T1-T5.

Excess part of the conductive member 40 deposited on the substrate is removed by polishing and the substrate is reversed. Thereby, the semiconductor device 100 illustrated in FIG. 1 is formed.

In the method illustrated in FIG. 3A to FIG. 4B, the first semiconductor substrate 20 and the second semiconductor substrate 30 are attached with each other in such a manner that the main surface S1 of the first semiconductor substrate 20 is opposite the main surface S2 of the second semiconductor substrate 30. By attaching the first semiconductor substrate 20 and the second semiconductor substrate 30, the first element disposed on the main surface S1 side of the first semiconductor substrate 20 and the second element disposed on the main surface S2 side of the second semiconductor substrate 30 are hermetically-sealed. In addition, in the above-described method, wiring connections to the first element and the second element can be formed with certainty.

Second Embodiment

Figure 5:
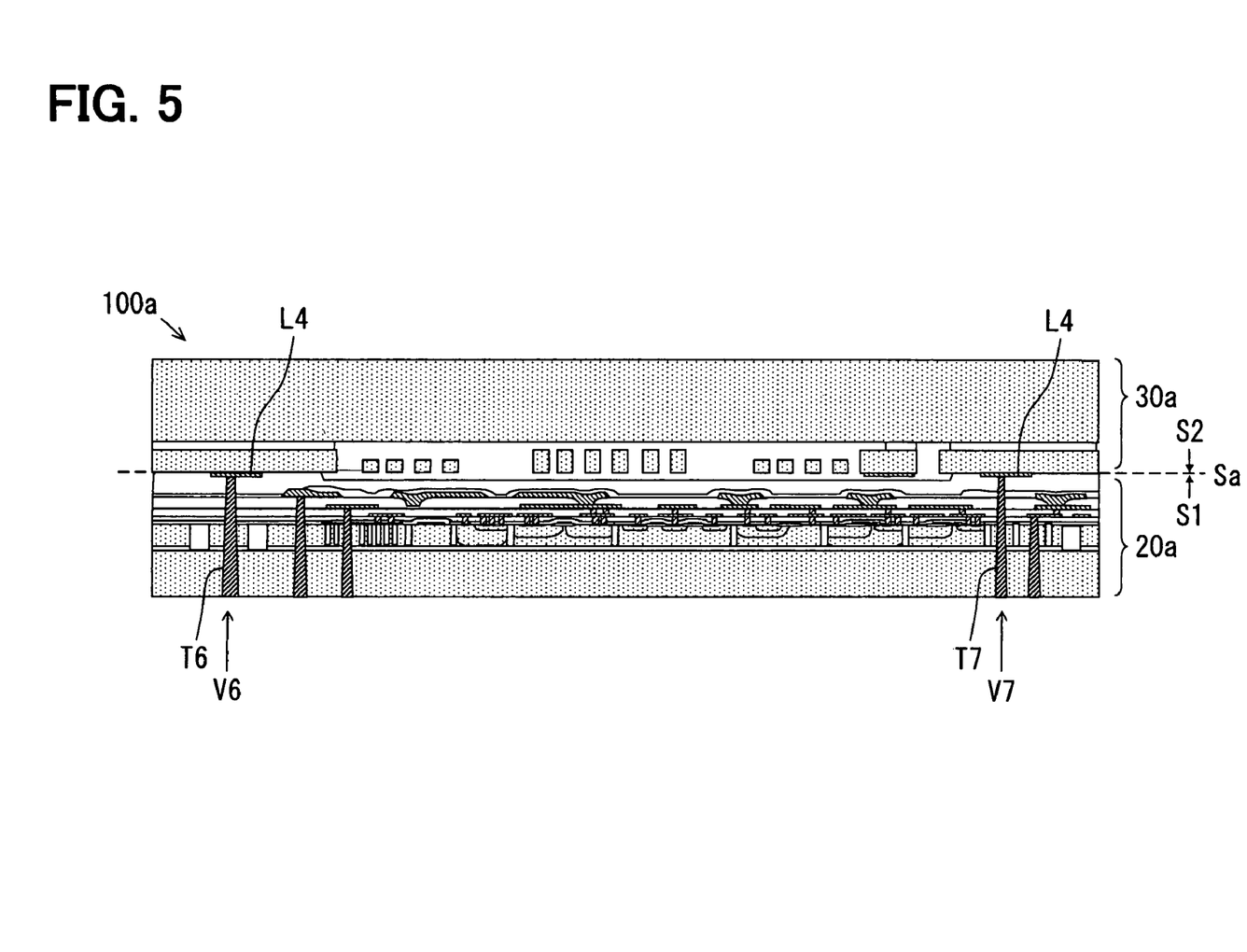
FIG. 5 is a cross-sectional diagram illustrating a semiconductor device according to a second embodiment of the present invention.

A semiconductor device 100a according to a second embodiment of the present invention will be described with reference to FIG. 5.

The semiconductor device 100a includes a first semiconductor substrate 20a and a second semiconductor substrate 30a. The first semiconductor substrate 20a includes a first element. The first element is disposed on a main surface S1 side of the first semiconductor substrate 20a. The first element may be an element configurating a control circuit of a dynamic quantity sensor element. The second semiconductor substrate 30a includes a second element. The second element is disposed on a main surface S2 side of the second semiconductor substrate 30a. The second element may be the dynamic quantity sensor element. The first semiconductor substrate 20a and the second semiconductor substrate 30a are attached with each other in such a manner that the main surface S1 of the first semiconductor substrate 20a is opposite the main surface S2 of the second semiconductor substrate 30a. The second semiconductor substrate 30a includes a wiring layer L4 on the main surface S2 side of the second semiconductor substrate 30a. The semiconductor device 100 has holes T6 and T7 provided from a rear surface of the first semiconductor substrate 20a to the wiring layer L4 through the first semiconductor substrate 20a. Sidewalls of the holes T6 and T7 are insulated, and the holes T6 and T7 are filled with a conductive member to configurate drawing wiring layers V6 and V7.

Third Embodiment

A semiconductor device 100b according to a third embodiment of the present invention will be described with reference to FIG. 6.

The semiconductor device 100b includes a first semiconductor substrate 20b and a second semiconductor substrate 30b. The first semiconductor substrate 20b includes a first element. The first element is disposed on a main surface S1 side of the first semiconductor substrate 20b. The first element may be a dynamic quantity sensor element. The second semiconductor substrate 30b includes a second element. The second element is disposed on a main surface S2 side of the second semiconductor substrate 30b. The second element may be an element configurating a control circuit of the dynamic quantity sensor element. The first semiconductor substrate 20b and the second semiconductor substrate 30b are attached with each other in such a manner that the main surface S1 of the first semiconductor substrate 20b is opposite the main surface S2 of the second semiconductor substrate 30b.

The dynamic quantity sensor element formed on the main surface S1 side of the first semiconductor substrate includes movable electrodes E1 and fixed electrodes E2. The movable electrodes E1 are movable. Each of the movable electrodes E1 has a surface that is opposite a surface of an adjacent one of the fixed electrodes E2. The first semiconductor substrate 20b includes a wiring layer L5 on the main surface S1 side. The second semiconductor substrate 30b includes a wiring layer L6 on the main surface S2 side. Each of the wiring layers L5 and L6 can function as an electrode. The movable electrodes E1 are located between the wiring layers L5 and L6. The semiconductor device 100b has holes T8 and T9 provided from a rear surface of the first semiconductor substrate 20b to the wiring layer L5 and L6 through the first semiconductor substrate 20b. Sidewalls of the holes T8 and T9 are insulated and the holes T8 and T9 are filled with a conductive member so as to configurate drawing wiring layers V8 and V9.

Figure 6:
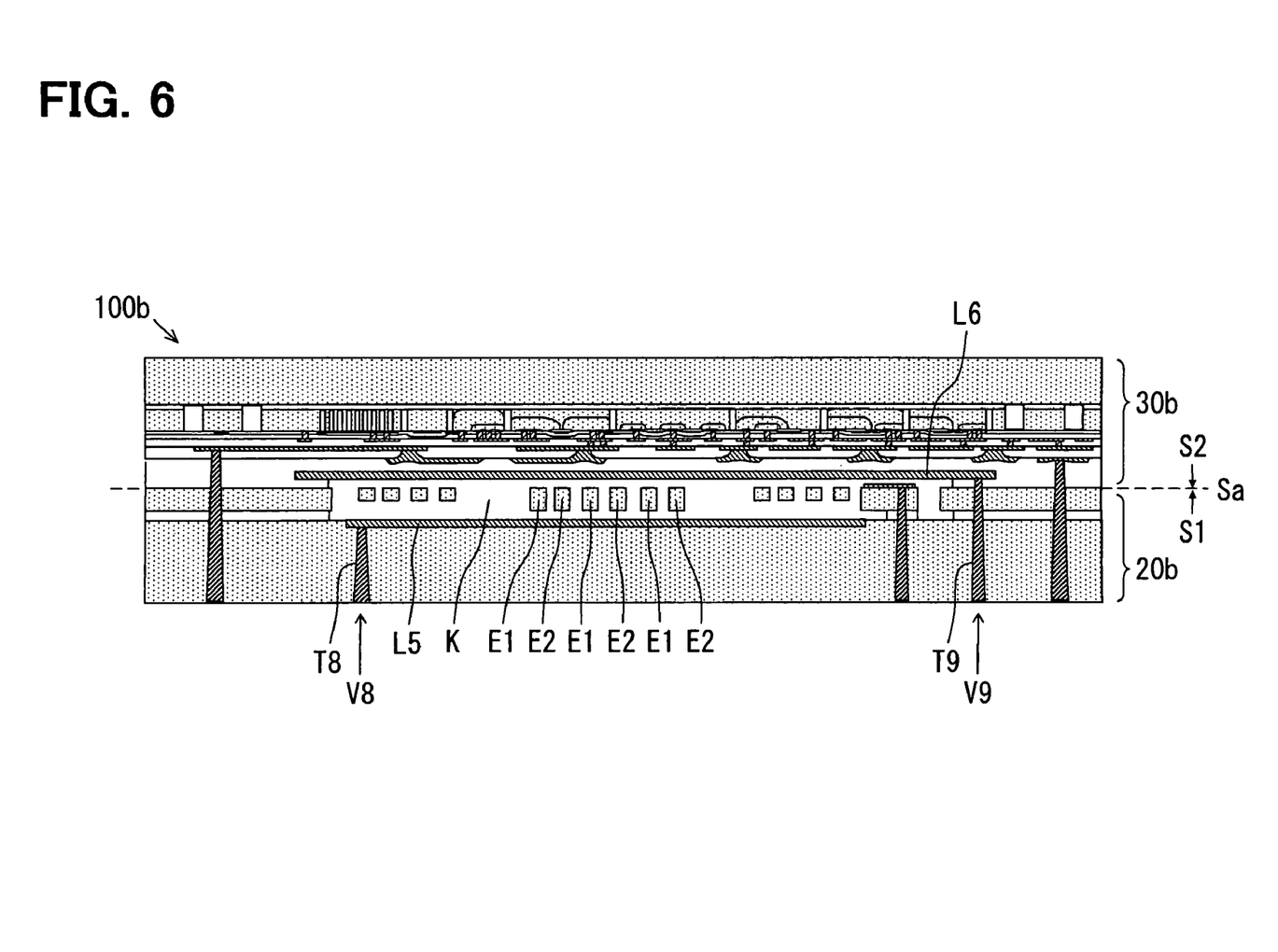
FIG. 6 is a cross-sectional diagram illustrating a semiconductor device according to a third embodiment of the present invention.

The semiconductor device 100b can detect dynamic quantity applied in a direction perpendicular to the opposite surfaces, that is, a right-left direction in FIG. 6. In addition, the semiconductor device 100b can detect dynamic quantity applied in a vertical direction, that is, an upper-lower direction in FIG. 6 by a combination of the wiring layers L5 and L6 and the movable electrodes E1.

In each of the semiconductor devices 100a and 100b, the first element and the second element can be hermetically-sealed by attaching the first semiconductor substrate 20a, 20b and the second semiconductor substrate 30a, 30b with each other in such a manner that the main surface S1 of the first semiconductor substrate 20a, 20b is opposite the main surface S2 of the second semiconductor substrate 30a, 30b. In addition, wiring connections to the first element and the second element that are three-dimensionally arranged can be formed with certainty.

In each of the semiconductor devices 100, 100a, and 100b, one of the first element and the second element may be the dynamic quantity sensor element and the other one of the first element and the second element may be the element configurating the control circuit of the dynamic quantity sensor element. The first element and the second element may be any sensor element and an element configurating a control circuit of the sensor element. For example, each of the semiconductor devices 100, 100a, and 100b may be a sensor device including an infrared-ray emitting element and an infrared-ray receiving element. In this case, the sensor element may include one of the infrared-ray emitting element and the infrared-ray receiving element. Alternatively, the first element and the second element may be other elements without being limited to a sensor element and an element configurating a control circuit of the sensor element.

Fourth Embodiment

Figure 7:
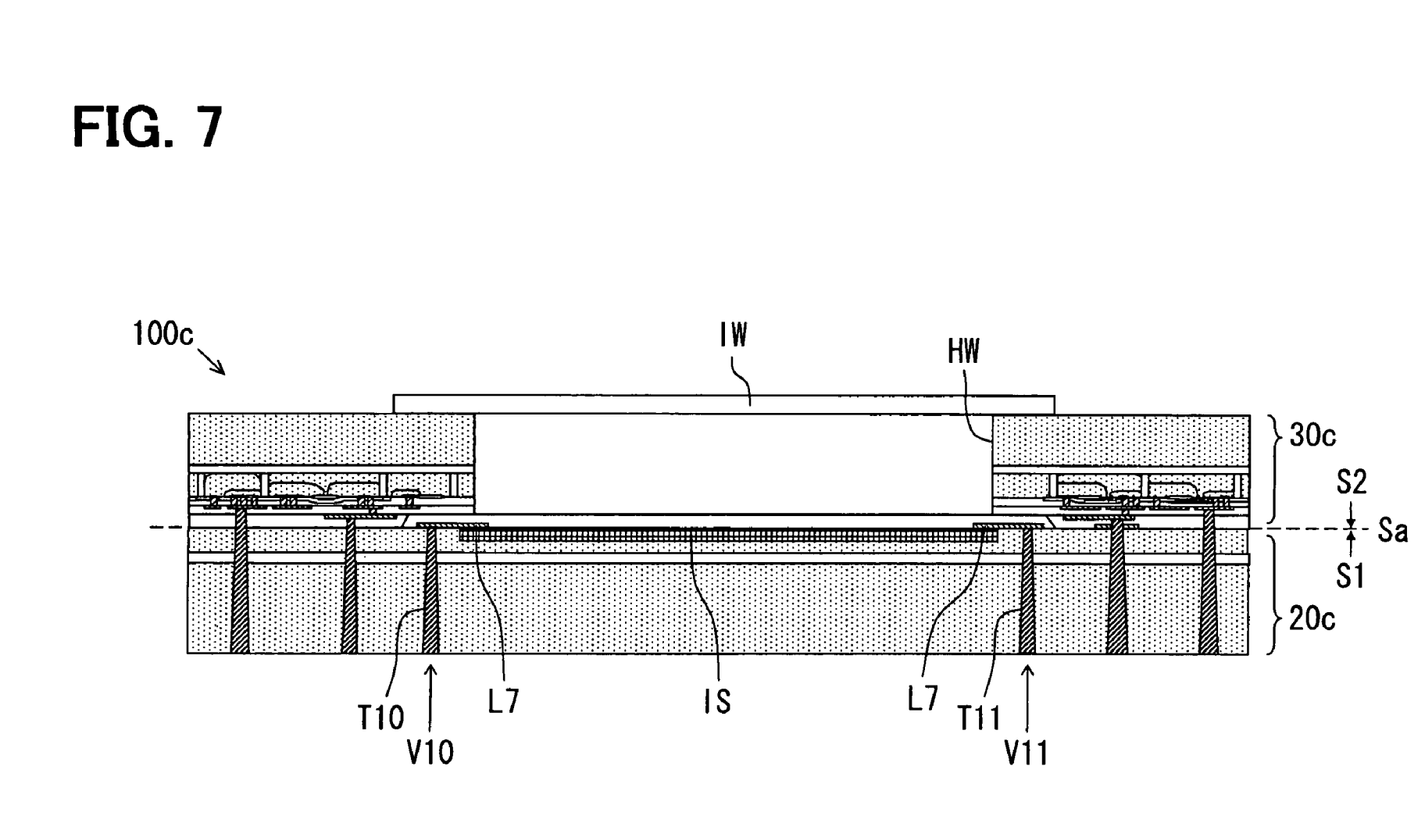
FIG. 7 is a cross-sectional diagram illustrating a semiconductor device according to a fourth embodiment of the present invention.

A semiconductor device 100c according to a fourth embodiment of the present invention will be described with reference to FIG. 7.

The semiconductor device 100c includes a first semiconductor substrate 20c and a second semiconductor substrate 30c. The first semiconductor substrate 20c includes a first element. The first element is disposed on a main surface S1 side of the first semiconductor substrate 20c. The first element may be an image sensor element IS. The second semiconductor substrate 30c includes a second element. The second element is disposed on a main surface S2 side of the second semiconductor substrate 30c. The second element may be an element configurating a control circuit of the image sensor element IS. The first semiconductor substrate 20c and the second semiconductor substrate 30c are attached with each other in such a manner that the main surface S1 of the first semiconductor substrate S1 is opposite the main surface S2 of the second semiconductor substrate 30c. The first semiconductor substrate 20c includes a wiring layer L7 on the main surface S1 side. The wiring layer L7 configurates an electrode coupled with the image sensor element IS. The semiconductor device 100c includes holes T10 and T11 provided from a rear surface of the first semiconductor substrate 20c to the wiring layer L7 through the first semiconductor substrate 20c. Sidewalls of the holes T10 and T11 are insulated and the holes T10 and T11 are filled with a conductive member so as to configurate drawing wiring layers V10 and V11. The second semiconductor substrate 30c has a hole HW above the image sensor element IS. On a rear surface of the second semiconductor substrate 30c, an incident window IW made of a glass plate is attached so as to cover the hole HW. The image sensor IS receives a light through the incident window IW.

Also in the semiconductor device 100c, the first element and the second element can be hermetically-sealed by attaching the first semiconductor substrate 20c and the second semiconductor substrate 30c with each other in such a manner that the main surface S1 of the first semiconductor substrate 20c is opposite the main surface S2 of the second semiconductor substrate 30c. In addition, wiring connections to the first element and the second element that are three-dimensionally arranged can be formed with certainty.

The first element and the second element in the above-described embodiments may be any sensor element and an element configurating a control circuit of the sensor element. When one of the first element and the second element is the dynamic quantity sensor element, the space K is provided between the opposite surfaces of the movable electrode and the fixed electrode. Even when one of the first element and the second element is the dynamic quantity sensor element requiring the space K and the other one of the second element is the element configurating the control circuit of the dynamic quantity sensor element, the first element and the second element can be hermetically-sealed with certainty and a dimension of a dynamic quantity sensor device can be restricted.

A detail of each of drawing wiring layers V1-V11 will be described below.

Figure 8A:
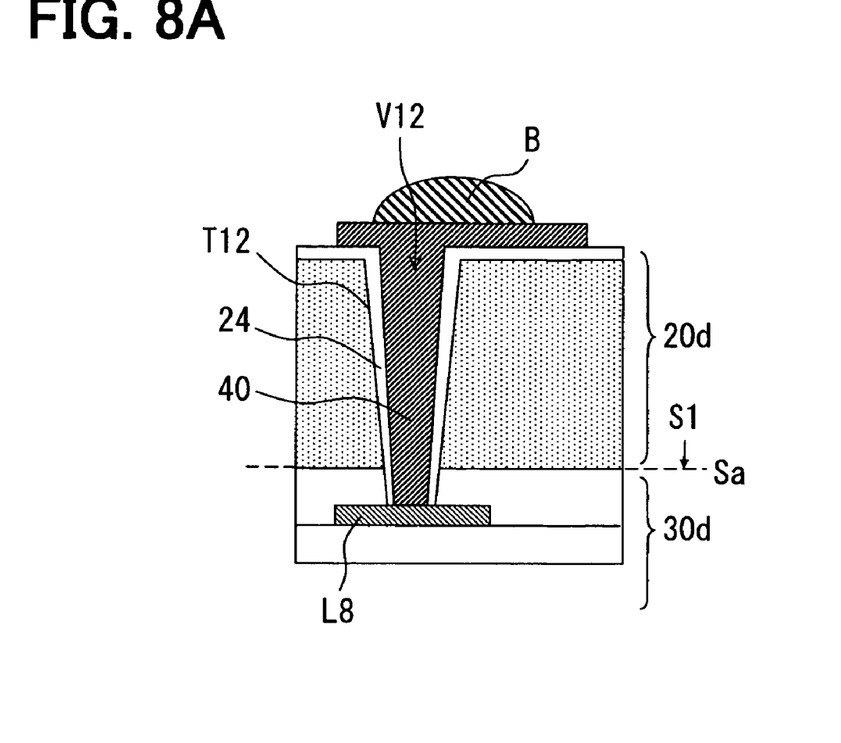
FIG. 8A is a cross-sectional diagram illustrating a drawing wiring layer on which a bump is disposed and FIG. 8B is a cross-sectional diagram illustrating a drawing wiring layer to which a wire is bonded.
Figure 8B:
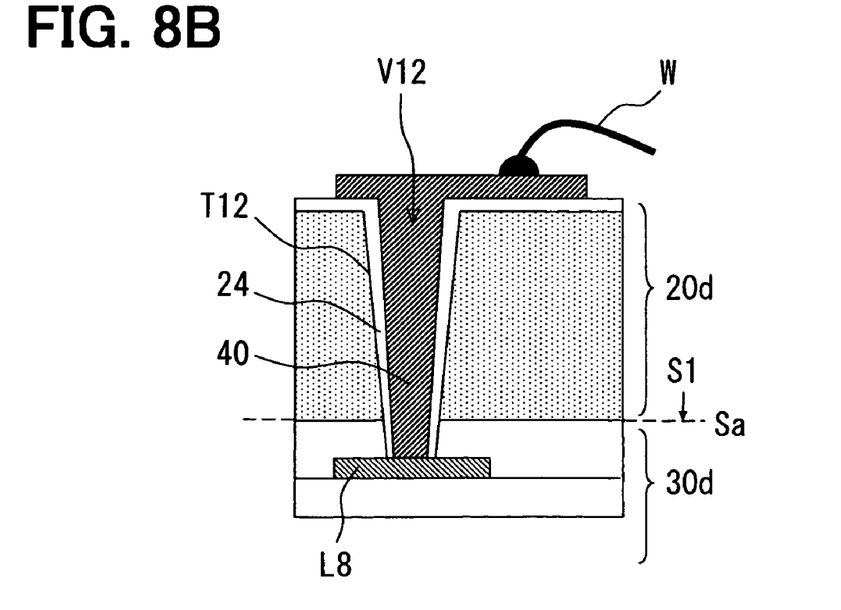

A drawing wiring layer V12 illustrated in FIG. 8A and FIG. 8B has a configuration similar to each of the drawing wiring layers V1-V11. In an example illustrated in FIG. 8A, a bump B is formed on the drawing wiring layer V12. In an example illustrated in FIG. 8B, a wire W is bonded to the drawing wiring layer V12. In FIG. 8A and FIG. 8B, a first semiconductor substrate 20d and a second semiconductor substrate 30d are reversed with respect to the semiconductor devices 100, 100a to 100c.

The second semiconductor substrate 30d includes a wiring layer L8 disposed on a main surface thereof. A hole T12 is provided from a rear surface of the first semiconductor substrate 20d to the wiring layer L8 through the first semiconductor substrate 20d. The first semiconductor substrate 20d and the second semiconductor substrate 30d are heat-treated, and thereby an insulating layer 24 is formed on a sidewall of the hole T12. The hole T12 is filled with the conductive member. The wiring layer L8 in FIG. 6 may be formed in the first semiconductor substrate 20d.

At the drawing wiring layer V12 in FIG. 8A and FIG. 8B, the conductive member 40 protrudes from the hole T12 onto the rear surface of the first semiconductor substrate S1 so as to be exposed to an outside. In the example illustrated in FIG. 8A, the bump B coupling the conductive member 40 is formed. In the example illustrated in FIG. 8B, the wire W is bonded to the conductive member 40. Because the conductive member 40 is formed on the rear surface of the first semiconductor substrate 20d so as to be exposed to the outside, the bump B can be disposed directly on the conductive member 40 and the wire W can be bonded directly to the conductive member 40.

In each of the above-described embodiments, the first semiconductor substrate including the first element formed on the main surface thereof and the second semiconductor substrate including the second element formed on the main surface thereof are attached to each other in such a manner that the main surface of the first semiconductor substrate is opposite the main surface of the second semiconductor substrate. By attaching the first semiconductor substrate and the second semiconductor substrate, the first element and the second element can be hermetically-sealed. In addition, the wiring connections to the first element and the second element can be formed with certainty.

What is claimed is:

1. A semiconductor device comprising:
a first semiconductor substrate having a first surface and a second surface, the first semiconductor substrate including a first element on a first-surface side of the first semiconductor substrate;
a second semiconductor substrate having a first surface and a second surface, the second semiconductor substrate including a second element and a wiring part on a first-surface side of the second semiconductor substrate, the second semiconductor substrate attached with the first semiconductor substrate in such a manner that the first surface of the second semiconductor substrate is opposite the first surface of the first semiconductor substrate;
a hole provided from the second surface of the first semiconductor substrate to the wiring part on the first-surface side of the second semiconductor substrate through the first semiconductor substrate, the hole having an insulated sidewall; and
a drawing wiring part made of a conductive member and filling the hole, wherein
the first element is a dynamic quantity sensor element, which includes a movable electrode and a fixed electrode;
the second element is an element configured as a control circuit of the sensor element;
the first semiconductor substrate includes a silicon-on-insulator substrate having a buried oxide layer;
the movable electrode is formed by a sacrifice-layer etching of a part of the buried oxide layer;
the movable electrode has a surface that is opposite a surface of the fixed electrode;
the movable electrode is movable in a direction perpendicular to the opposite surfaces of the movable and fixed electrodes in accordance with a dynamic quantity applied to the dynamic quantity sensor element;
the dynamic quantity sensor element is configured to detect a change in an electrostatic capacity provided between the opposite surfaces of the movable electrode and the fixed electrode for detecting the dynamic quantity;
the wiring part includes a third wiring layer and a fourth wiring layer;
the third wiring layer is disposed at a first depth from the first surface of the second semiconductor substrate;
the fourth wiring layer is disposed at a second depth from the first surface of the second semiconductor substrate;
the second depth is deeper than the first depth, increasing depth being in the direction of the second surface of second substrate from the first surface of the second substrate;
the drawing wiring part includes a third drawing wiring layer that reaches the fourth wiring layer through a part of the third wiring layer; and
the third drawing wiring layer is coupled with the third wiring layer and the fourth wiring layer.

2. The semiconductor device according to claim 1, wherein:
the wiring part includes a first wiring layer and a second wiring layer disposed at different depths from the first surface of the second semiconductor substrate;
the drawing wiring part includes a first drawing wiring layer and a second drawing wiring layer;
the first drawing wiring layer reaches the first wiring layer; and
the second drawing wiring layer reaches the second wiring layer.

3. The semiconductor device according to claim 1, wherein
the first semiconductor substrate further includes a wiring part on the first-surface side of the first semiconductor substrate,
the semiconductor device further comprising:
another hole provided from the second surface of the first semiconductor substrate to the wiring part on the first-surface side of the first semiconductor substrate through the first semiconductor substrate, the another hole having an insulated sidewall; and
another drawing wiring part made of a conductive member and filling the another hole.

4. The semiconductor device according to claim 3, wherein
the wiring part on the first-surface side of the first semiconductor substrate is disposed on the first surface of the first semiconductor substrate.

5. The semiconductor device according to claim 1, wherein:
the first semiconductor substrate further includes a wiring part on the first-surface side of the first semiconductor substrate;
the semiconductor device further comprises another hole that reaches the wiring part on the first-surface side of the second semiconductor substrate through a part of the wiring part on the first-surface side of the first semiconductor substrate; and
the drawing wiring part includes a fourth drawing wiring layer that fills the another hole and is coupled with the wiring part on the first-surface side of the second semiconductor substrate and the wiring part on the first-surface side of the first semiconductor substrate.

6. The semiconductor device according to claim 5, wherein
the wiring part on the first-surface side of the first semiconductor substrate is disposed on the first surface of the first semiconductor substrate.

7. The semiconductor device according to claim 1, wherein the conductive member includes one of metal and polycrystalline silicon.

8. The semiconductor device according to claim 1, further comprising a bump, wherein:
the drawing wiring part protrudes from the hole onto the second surface of the first semiconductor substrate; and
the bump is disposed on the drawing wiring part.

9. The semiconductor device according to claim 1, further comprising a wire, wherein:
the drawing wiring part protrudes from the hole onto the second surface of the first semiconductor substrate; and
the wire is bonded to the drawing wiring part.

10. The semiconductor device according to claim 1, wherein
the third wiring layer and the fourth wiring layer are disposed in the second semiconductor substrate.

11. The semiconductor device according to claim 1, wherein:
the second semiconductor substrate includes a silicon-on-insulator substrate having a buried oxide layer; and
the first element and the second element are hermetically-sealed in the first semiconductor substrate and the second semiconductor substrate attached with each other.

12. The semiconductor device according to claim 1, wherein the fourth wiring layer has a fourth circular ring shape, the third wiring layer has a third circular ring shape, and the diameter of the fourth circular ring shape is greater than the third circular ring shape.

13. The semiconductor device according to claim 1, wherein the fourth wiring layer has a fourth square ring shape, the third wiring layer has a third square ring shape, and the perimeter of the fourth square ring shape is greater than the diameter of the third square ring shape.

14. The semiconductor device according to claim 1, wherein the fourth wiring layer has a fourth lattice shape, the third wiring layer has a third lattice shape, and the perimeter around the fourth lattice shape is greater than the perimeter around the third lattice shape.

* * * * *